(12) United States Patent
Liu et al.

(10) Patent No.: US 11,683,025 B1
(45) Date of Patent: Jun. 20, 2023

(54) SELF-CALIBRATING TIMING GENERATOR

(71) Applicant: RICHTEK TECHNOLOGY CORP., Hsinchu County (TW)

(72) Inventors: Yu-Hsuan Liu, New Taipei (TW); Yung-Chun Chuang, Taipei (TW)

(73) Assignee: RICHTEK TECHNOLOGY CORP., Hsinchu County (TW)

( * ) Notice: Subject to any disclaimer, the term of this patent is extended or adjusted under 35 U.S.C. 154(b) by 0 days.

(21) Appl. No.: 17/849,747

(22) Filed: Jun. 27, 2022

(30) Foreign Application Priority Data

Mar. 29, 2022 (TW) .................................. 111111812

(51) Int. Cl.
| | |
|---|---|
| *H03K 3/00* | (2006.01) |
| *H03K 3/017* | (2006.01) |
| *H03K 5/24* | (2006.01) |
| *H03K 3/037* | (2006.01) |
| *H03K 19/20* | (2006.01) |

(52) U.S. Cl.
CPC ............. *H03K 3/017* (2013.01); *H03K 3/037* (2013.01); *H03K 5/24* (2013.01); *H03K 19/20* (2013.01)

(58) Field of Classification Search
CPC ... G04F 5/00; H03K 3/00; H03K 3/64; H03K 3/78

USPC ........................................................ 327/291
See application file for complete search history.

(56) References Cited

U.S. PATENT DOCUMENTS

| | | | |
|---|---|---|---|
| 9,461,632 B2* | 10/2016 | Sano ..................... | H03K 3/0231 |
| 2010/0164638 A1* | 7/2010 | Saw ...................... | H03K 3/0231 |
| | | | 331/111 |
| 2010/0302698 A1* | 12/2010 | Ueda ..................... | H02H 9/001 |
| | | | 361/93.1 |

* cited by examiner

*Primary Examiner* — Quan Tra
(74) *Attorney, Agent, or Firm* — Winston Hsu

(57) ABSTRACT

A timing generator includes a first current source, a first switch, a second current source, a second switch, a third switch, a capacitor, a signal synthesizer, and a timing difference extractor. The first current source is for generating a first current according to the input voltage. The second current source is for generating a second current according to the input voltage. The first switch includes a control terminal for receiving a charging signal. The second switch includes a control terminal for receiving a timing difference signal. The third switch includes a control terminal for receiving a reset signal. The capacitor is coupled between a charging terminal and a ground terminal. The signal synthesizer is for generating a timing signal according to a charging voltage and a reference voltage. The timing difference extractor is for generating a timing difference signal according to the timing signal and a deformed timing signal.

18 Claims, 14 Drawing Sheets

SELF-CALIBRATING TIMING GENERATOR

BACKGROUND OF THE INVENTION

1. Field of the Invention

The present invention is related to a timing generator, and more particularly to a timing generator capable of self-calibrating the pulse-width of the timing signal.

2. Description of the Prior Art

In an analog circuit, analog signals can change continuously, and there are almost no restrictions on the timing and the amplitude of the signal. Therefore, in analog circuits, voltage and current can be directly implemented in control circuit, such as volume control, luminosity control etc. However, analog circuits inherit many problems, such as control signals easily drifted with time, adjustment difficulty, large power consumption, and susceptible to noise and environmental interference.

Different from analog circuits, digital circuits can only have values within a predetermined range and its output can only be in two states (i.e., ON and OFF). Therefore, digitalized voltage and current are feed into the analog circuit by repeating the pulse sequence. A timing generator is a circuit for generating precise clock signals with adjustable timing, providing the "heartbeat" signals required for the operation of various digital circuits. It is widely used in electronic devices, such as chip testers, pulse-width generators, logic analyzers, oscilloscopes and digital converters. Taking a computer system as an example, each computer system a few timing generators to provide a dozen sets of reference signals to control the processor speed, memory access, streaming media, network transmission, and wireless communication, etc.

With the advancement in the integrated circuit technology, timing generators can be embedded with other analog and digital circuits on the same chip. However, after the timing signal generated by the timing signal generator passes through an external circuit, the timing signal may be delayed or deformed due to various interferences, resulting in the deformed timing signal having a different pulse width from the original timing signal. The clock speed of today's high-speed circuits is in the nanosecond range, thus even very short delay or deformation of the timing signal may cause different operations of the chip to be out of synchronization.

SUMMARY OF THE INVENTION

The embodiment provides a timing generator including a first current source, a first switch, a second current source, a second switch, a third switch, a capacitor, a signal synthesizer, and a timing difference extractor. The first current source is for generating a first current according to an input voltage. The second current source is for generating a second current according to the input voltage. The first switch includes a first terminal coupled to the first current source, a second terminal coupled to a charging terminal, and a control terminal for receiving a charging signal. The second switch includes a first terminal coupled to the second current source, a second terminal coupled to the charging terminal, and a control terminal for receiving a timing difference signal. The third switch includes a first terminal coupled to the charging terminal, a second terminal coupled to a ground terminal, and a control terminal for receiving a reset signal. The capacitor is coupled between the charging terminal and the ground terminal. The signal synthesizer coupled to the charging terminal is for generating a timing signal according to a charging voltage and a reference voltage. The timing difference extractor coupled to the signal synthesizer and the control terminal of the second switch is for generating a timing difference signal according to the timing signal and a deformed timing signal.

The embodiment provides another timing generator including a first current source, a first switch, a second current source, a second switch, a third switch, a fourth switch, a first capacitor, a second capacitor, a signal synthesizer, and a timing difference extractor. The first current source is for generating a first current according to an input voltage. The first switch includes a first terminal coupled to the first current source, a second terminal coupled to a charging terminal, and a control terminal for receiving a charging signal. The second switch includes a first terminal coupled to a bias terminal, a second terminal, and a control terminal for receiving a timing difference signal. The second current source coupled to the second terminal of the second switch is for generating a second current according to the input voltage. The third switch includes a first terminal coupled to the charging terminal, a second terminal coupled to a ground terminal, and a control terminal for receiving a reset signal. The fourth switch includes a first terminal, a second terminal coupled to the bias terminal, and a control terminal for receiving a reset signal. The first capacitor is coupled between the charging terminal and a ground terminal. The second capacitor is coupled between a bias terminal and the first terminal of the fourth switch. The signal synthesizer coupled to the charging terminal is for generating a timing signal according to a charging voltage and an offset reference voltage. The timing difference extractor coupled to the signal synthesizer and the control terminal of the second switch is for generating a timing difference signal according to the timing signal and a deformed timing signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
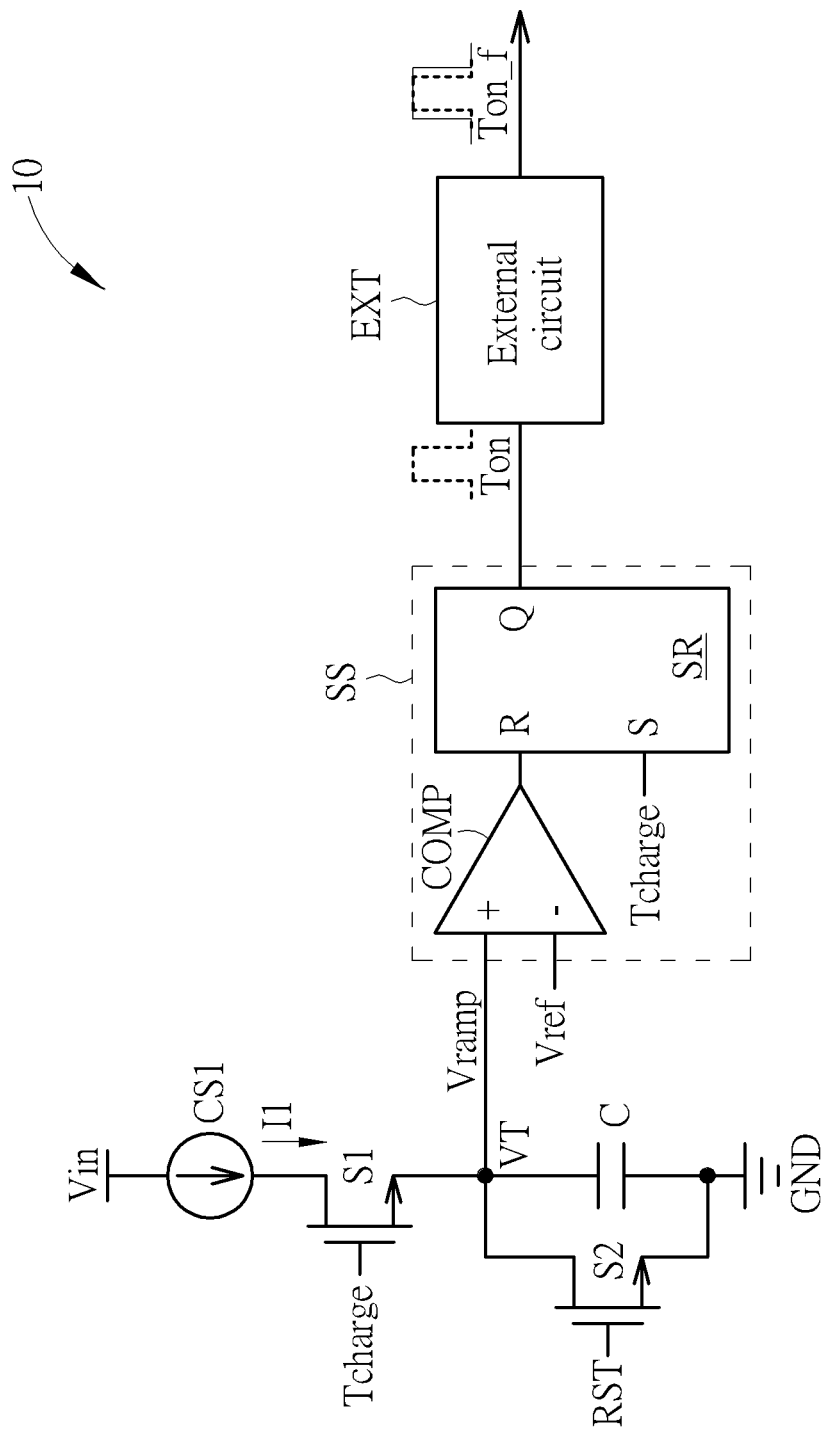
FIG. 1 is a diagram of a timing generator of an embodiment.

FIG. 1 is a diagram of a timing generator 10 of an embodiment. Timing generator 10 includes a first current source CS1, a first switch S1, a second switch S2, a capacitor C and a signal synthesizer SS. The first current source CS1 is for generating the first current I1 according to the input voltage Vin. The first switch S1 includes a first terminal coupled to the first current source CS1, a second terminal coupled to the charging terminal VT, and a control terminal for receiving the charging signal Tcharge. The capacitor C is coupled between the charging terminal VT and the ground terminal GND. The signal synthesizer SS is for generating the timing signal Ton according to the charging voltage Vramp and the reference voltage Vref. The signal synthesizer SS includes a comparator COMP and a latch SR. The comparator COMP includes a negative input terminal for receiving the reference voltage Vref, and a positive input terminal coupled to the charging terminal VT for receiving the charging voltage Vramp. The latch SR includes a set terminal S for receiving the charging signal Tcharge, a reset terminal R coupled to the output terminal of the comparator COMP, and an output terminal Q for outputting the timing signal Ton. When the timing signal Ton passes through an external circuit EXT, the timing signal Ton may be delayed or deformed due to various interferences, causing the pulse width of the timing signal Ton to be different from the predetermined pulse width. As the result, a deformed timing signal Ton_f is produced. The propagation delay of the timing signal Ton may cause the falling edge of the deformed timing signal Ton_f to lag behind the falling edge of the timing signal Ton, and the activation delay of the timing signal Ton may cause the rising edge of the timing signal Ton to lag behind the rising edge of the deformed timing signal Ton_f.

Figure 2:
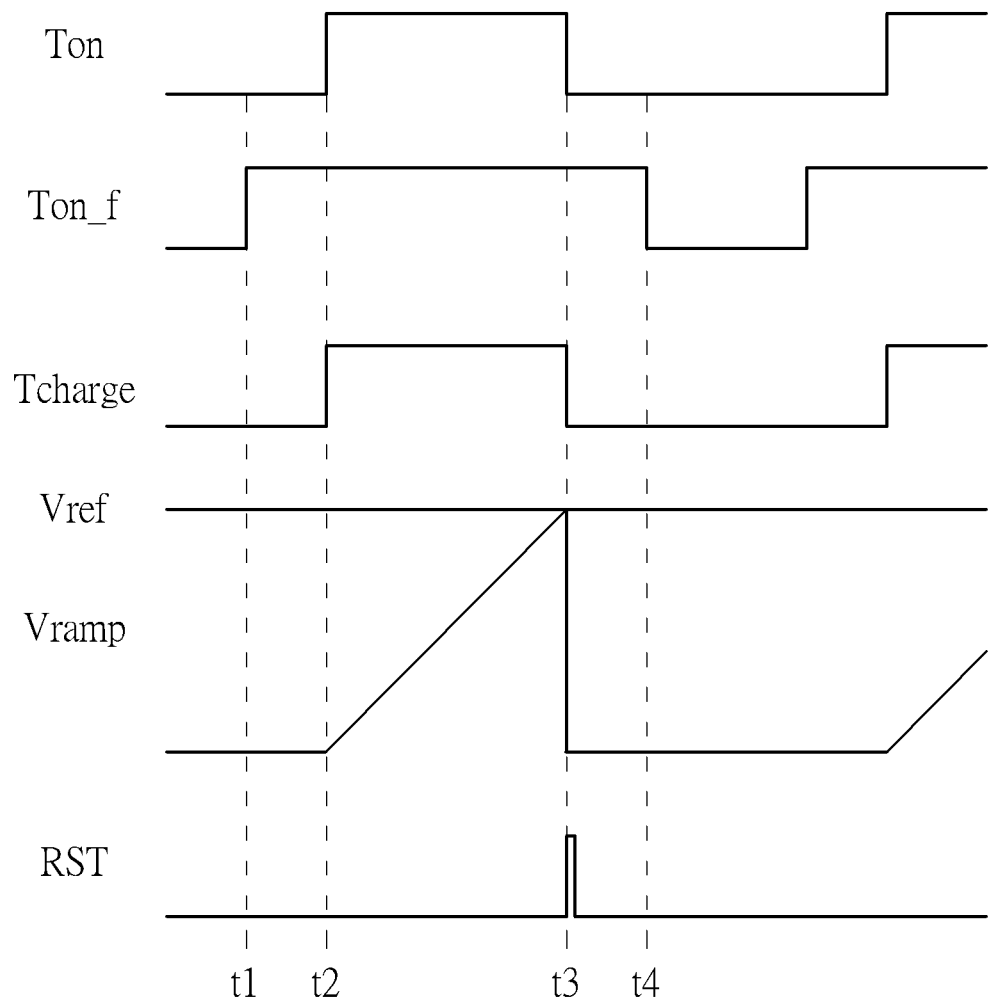
FIG. 2 is a timing diagram of the operation signals of the timing generator of FIG. 1.

Please refer to FIG. 1 and FIG. 2. FIG. 2 is a timing diagram of the operation signals of the timing generator 10 of FIG. 1. From time t1 to t2, the charging signal Tcharge is at the low level (e.g., 0V). The first switch S1 is turned off. The level of the charging voltage Vramp is lower than the level of the reference voltage Vref (e.g., 5V), so the comparator COMP outputs the low-level signal. The latch SR simultaneously receives the low-level charging signal Tcharge and the low-level comparator COMP output signal, so the output terminal Q outputs the low-level timing signal Ton (e.g., 0V). When the timing signal Ton passes through the external circuit EXT, the timing signal Ton may be delayed or deformed due to various interferences, causing the pulse width of the timing signal Ton to be deformed. As the result, the timing signal Ton_f may be high from time t1 to t2.

From time t2 to t3, the charging signal Tcharge rises to the high level. The high level charging signal Tcharge turns on the first switch S1, and the first current source CS1 starts to charge the capacitor C with the first current I1 making the charging voltage Vramp to rise continuously. The latch SR simultaneously receives the high-level charging signal Tcharge and the low-level comparator COMP output signal, so that the timing signal Ton output by the output terminal Q may rise to the high level (e.g., 5V).

At time t3, the charging voltage Vramp reaches the level of the reference voltage Vref. The output signal of the comparator COMP rises to the high level, and the charging signal Tcharge falls to the low level. The latch SR simultaneously receives the low-level charging signal Tcharge and the high-level output signal of the comparator COMP, so the timing signal Ton output by the output terminal Q drops to the low level. Ideally, the pulse width of the charging signal Tcharge should be substantially equal to the pulse width of the timing signal Ton. At this time, the reset signal RST, which is a rapid pulse signal with quick transient change in the amplitude, is activated, and the second switch S2 is turned on for a short period of time to release the charging voltage Vramp accumulated at the charging terminal VT. Thus, the charging voltage Vramp quickly drops to the low level. However, from time t3 to t4, the timing signal Ton is at the low level, and the deformed timing signal Ton_f may be delayed due to various interferences. This can result in the internal functioning circuits of the chip to operate out of synchronization causing further computational error. Therefore, the pulse width of the deformed timing signal Ton_f needs to be calibrated to the preset pulse width of the timing signal Ton. This can be done by the calibration mechanism illustrated in the following embodiments.

Figure 3:
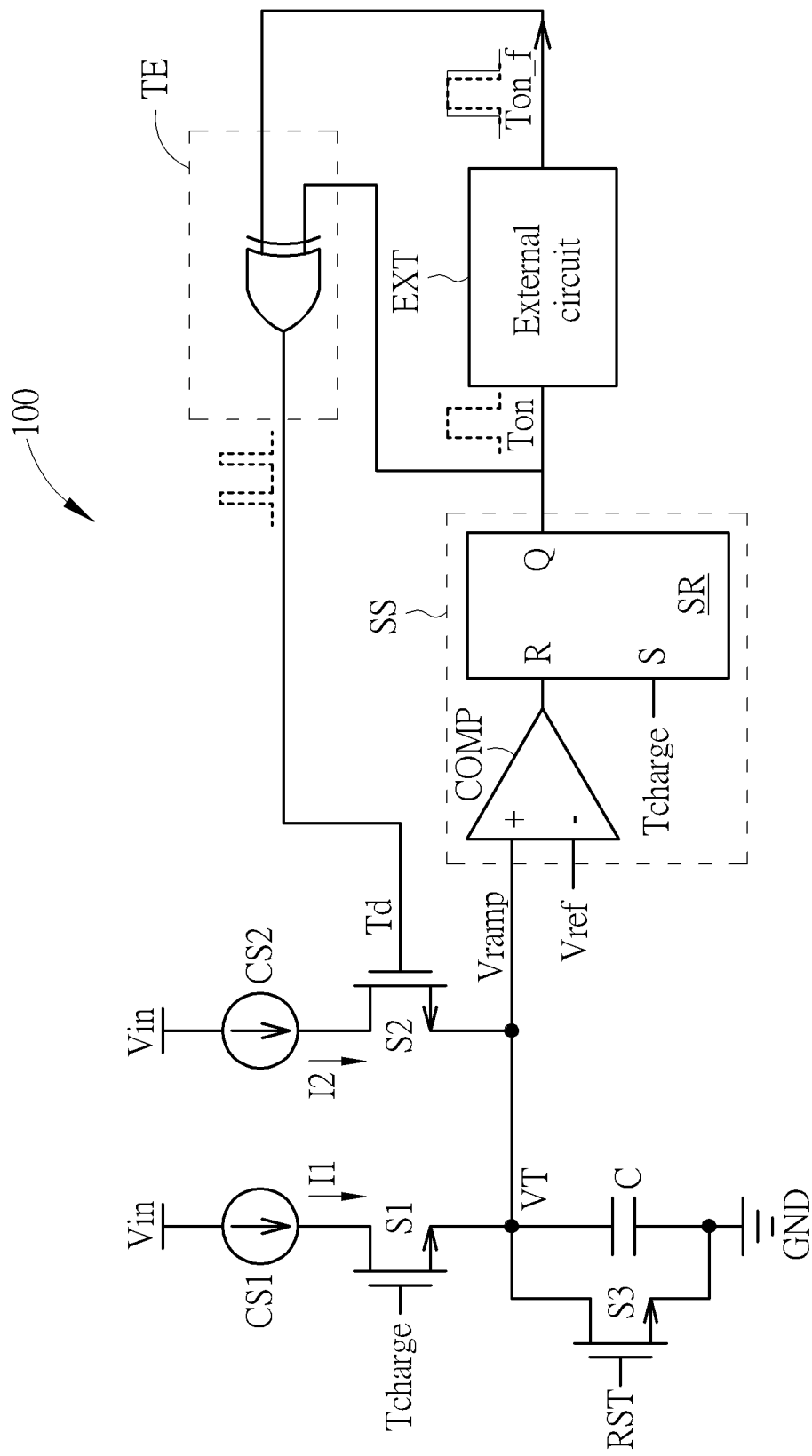
FIG. 3 is a diagram of a timing generator of an embodiment.

FIG. 3 is a diagram of a timing generator 100 of an embodiment. The timing generator 100 includes a first current source CS1, a first switch S1, a second current source CS2, a second switch S2, a third switch S3, a capacitor C, a comparator COMP, and a timing difference extractor TE. The first current source CS1 is for generating the first current I1 according to the input voltage Vin. The first switch S1 includes a first terminal coupled to the first current source CS1, a second terminal coupled to the charging terminal VT, and a control terminal for receiving the charging signal Tcharge. The second current source CS2 is for generating the second current I2 according to the input voltage Vin. The second switch S2 includes a first terminal coupled to the second current source CS2, a second terminal coupled to the charging terminal VT, and a control terminal for receiving the timing difference signal Td. The third switch S3 includes a first terminal coupled to the charging terminal VT, a second terminal coupled to the ground terminal GND, and a control terminal for receiving the reset signal RST. The capacitor C is coupled between the charging terminal VT and the ground terminal GND. The signal synthesizer SS includes a comparator COMP and a latch SR. The comparator COMP includes a negative input terminal for receiving the reference voltage Vref, a positive input terminal coupled to the charging terminal VT for receiving the charging voltage Vramp, and an output terminal Q. The latch SR includes a set terminal S for receiving the charging signal Tcharge, a reset terminal R coupled to the output terminal of the comparator COMP, and an output terminal Q for outputting the timing signal Ton. The timing difference extractor TE is for generating the timing difference signal Td according to the timing signal Ton and a deformed timing signal Ton_f. The timing difference extractor TE includes a first input terminal coupled to the output terminal of the signal synthesizer SS, a second input terminal for receiving the deformed timing signal Ton_f output by the external circuit EXT, and an output terminal for outputting the timing difference signal Td.

In the embodiment, the first switch S1, the second switch S2 and the third switch S3 can be N-type transistors, such as bipolar junction transistors (BJT), metal-oxide-semiconductor field-effect transistors (MOSFET) or fin field-effect transistor (FinFET). However, the embodiment is not limited thereto, and other types of transistors should also fall within the scope of the present invention. The timing difference extractor TE may be an XOR gate. The timing difference between the deformed timing signal Ton_f and the timing signal Ton is caused by the external circuit EXT. In other words, when the timing signal Ton passes through the external circuit EXT, the timing signal Ton may be delayed or deformed due to various interferences. The pulse width of the deformed timing signal Ton_f would different from the original. The propagation delay of the timing signal Ton may cause the falling edge of the deformed timing signal Ton_f to lag behind the falling edge of the timing signal Ton, and the activation delay of the timing signal Ton may cause the rising edge of the timing signal Ton to lag behind the rising edge of the deformed timing signal Ton_f. The clock speed of today's high-speed circuits is in the nanosecond range, thus even very short delay or deformation of the timing signal may cause different operations of the chip to be out of synchronization. Therefore, the timing difference extractor TE can be implemented to extract the timing difference between the timing signal Ton and the deformed timing signal Ton_f. The extraction result is the timing difference signal Td. As shown in FIG. 3, the timing signal generator 100 has a feedback mechanism to apply the timing difference signal Td to calibrate the delay or deformation of the timing signal Ton. Thus, the operation of the high-speed circuit can be more precise.

Figure 4:
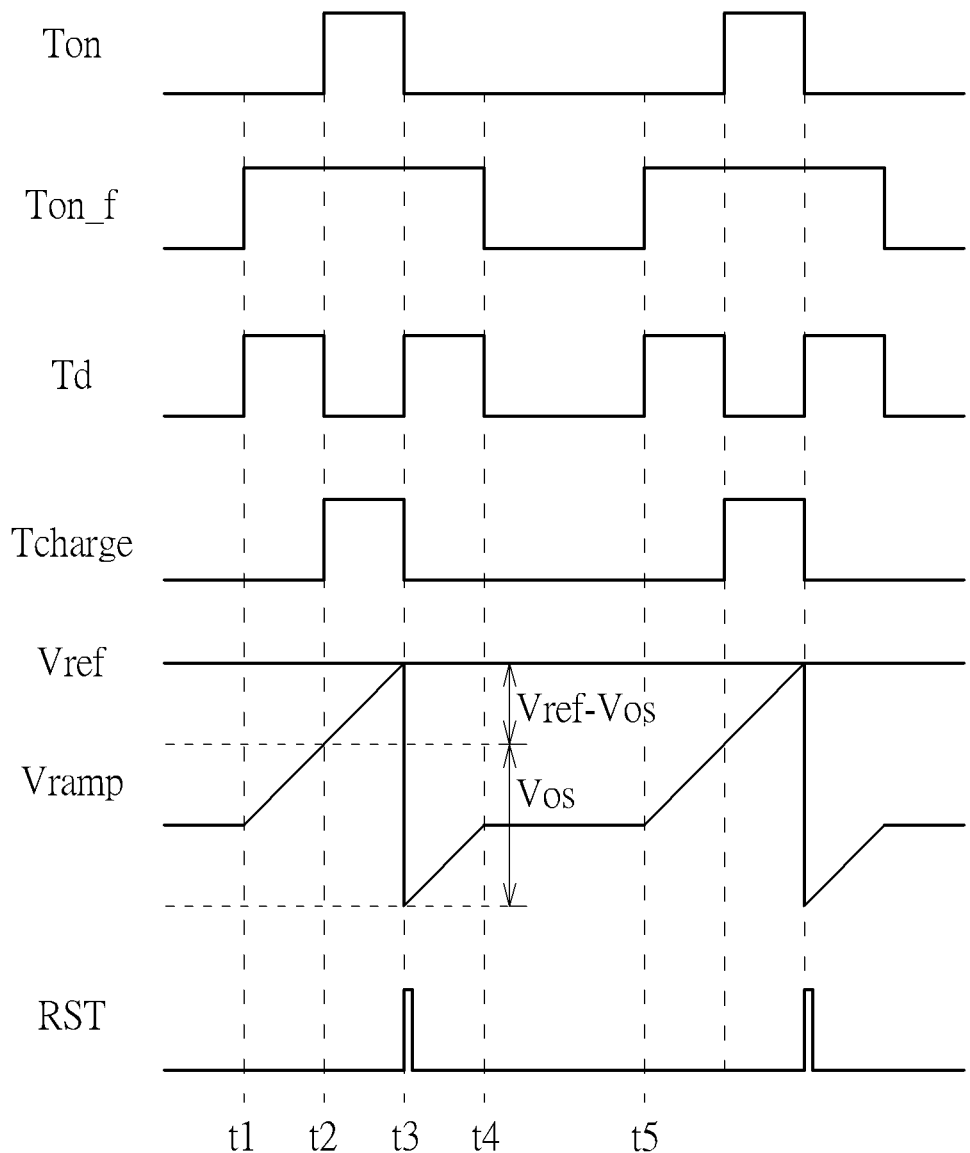
FIG. 4 is a timing diagram of the operation signals of the timing generator of FIG. 3.

Please refer to both FIGS. 3 and 4. FIG. 4 is a timing diagram of the operation signals of the timing generator 100 of FIG. 3. Between time t1 and time t2, the charging signal Tcharge is at the low level (e.g., 0V), so the first switch S1 is turned off. The charging voltage Vramp is lower than the reference voltage Vref (e.g., 5V), so the comparator COMP outputs the low-level signal. The latch SR simultaneously receives the low-level charging signal Tcharge and the low-level output signal of the comparator COMP, so the output terminal Q outputs the low-level timing signal Ton. At this time, the timing signal Ton is at the low level (e.g., 0V), and the deformed timing signal Ton_f is at the high level. The timing difference extractor TE performs XOR operation on the pulse widths of the timing signal Ton and the deformed timing signal Ton_f to generate the timing difference signal Td. Therefore, between the times t1 and t2, the timing difference signal Td is at the high level, making the second switch S2 to turned on. The second current source CS2 charges the capacitor C with the second current I2 to increase the charging voltage Vramp.

Between time t2 and t3, the charging signal Tcharge rises to the high level (e.g., 5V), and the latch SR simultaneously receives the high-level charging signal Tcharge and the low-level output signal from comparator COMP, so the timing signal Ton is raised to the high level (e.g., 5V). At this time, the timing signal Ton is at the high level, and the deformed timing signal Ton_f is also at the high level. The timing difference extractor TE performs XOR operation on the pulse widths of the timing signal Ton and the deformed timing signal Ton_f to obtain a timing difference signal Td, thus the timing difference signal Td generated by the timing difference extractor TE will be reduced to the low level. The high-level charging signal Tcharge turns on the first switch S1, and the low-level timing difference signal Td turns off the second switch S2. The second current source CS2 stops charging the capacitor C, and at the same time the first current source CS1 starts to charge the capacitor C with the first current I1, thus increasing the charging voltage Vramp. It should be noted that in order for the charging voltage Vramp to rise at a consistent rate, the current value of the first current I1 is substantially equal to the current value of the second current I2.

At time t3, the charging voltage Vramp reaches the level of the reference voltage Vref; the output signal of the comparator COMP rises to the high level, and the charging signal Tcharge falls to the low level. The latch SR simultaneously receives the low-level charging signal Tcharge and the high-level output signal of comparator COMP, so that the timing signal Ton output by the output terminal Q drops to the low level, while the deformed timing signal Ton_f remains at the high level. Ideally, the pulse width of the charging signal Tcharge should be substantially equal to the pulse width of the timing signal Ton. At this time, the reset signal RST, a rapid pulse signal with quick transient change in the amplitude, is activated, and the third switch S3 is turned on for a short period of time to release the charging voltage Vramp accumulated at the charging terminal VT. As the result, the charging voltage Vramp quickly drops to the low level. And between time t3 and time t4, the timing difference signal Td generated by the timing difference extractor TE through the above-mentioned operation rises to the high level, so the second switch S2 is turned on again; the capacitor C is charged with the second current I2, and the charging voltage Vramp rises again.

At time t4, the deformed timing signal Ton_f drops to the low level; the timing signal Ton maintains at the low level, and the timing difference signal Td generated by the timing difference extractor TE drops to the low level. The low-level charging signal Tcharge turns off the first switch S1, and the low-level timing difference signal Td turns off the second switch S2. Both the first current source CS1 and the second current source CS2 stop charging the capacitor C. The third switch S3 is in turned off, so the charging voltage Vramp is maintained at the same level.

At time t5, the timing signal generator 100 starts to generate the timing signal for the next cycle. The charging signal Tcharge maintained at the low level turning off the first switch S1. The level of the charging voltage Vramp is lower than the level of the reference voltage Vref, so that the comparator COMP outputs the low-level signal. The latch SR simultaneously receives the low-level charging signal Tcharge and the low-level output signal of the comparator COMP, so the output terminal Q outputs the low-level timing signal Ton. At this time, the timing signal Ton is at the low level, and the deformed timing signal Ton_f is at the high level. The timing difference extractor TE performs XOR operation on the pulse widths of the timing signal Ton and the deformed timing signal Ton_f to generate the timing difference signal Td. Thus, the timing difference signal Td is at the high level, and the second switch S2 is turned on. The second current source CS2 charges the capacitor C with the second current I2, so the charging voltage Vramp increases from the previous level. The subsequent operation process is the same as the process from time t1 to t4. The description is not repeated here. In this way, the timing signal generator 100 can consistently generate the timing signal Ton in each cycle according to circuit functions and requirements.

The pulse width of the timing signal Ton can be calibrated by the following formula:

$$I2 \times Td = C \times Vos$$

$$Vos = \frac{I2 \times Td}{C}$$

-continued $$I1 \times \text{Ton} = C \times (\text{Vref} - \text{Vos})$$

$$\text{Ton} = \frac{C \times (\text{Vref} - \text{Vos})}{I1} = \frac{C \times \left(\text{Vref} - \frac{I2 \times Td}{C}\right)}{I1} = \frac{C \times \text{Vref}}{I1} - Td$$

$$\text{Ton\_f} = \text{Ton} + Td = \frac{C \times \text{Vref}}{I1}$$

I1 is the first current. I2 is the second current. C is the capacitance of the capacitor. Td is the pulse width of the timing difference signal. Ton is the pulse width of the timing signal, Ton_f is the pulse width of the deformed timing signal. Vref is the reference voltage value. Vos is the offset voltage. The offset voltage, as indicated in FIG. 4, is the voltage accumulated from charging the capacitor C with the second current I2. The first current source CS1 charges the capacitor C with the first current I1 and the accumulated voltage at the capacitor C is Vref-Vos.

As described in the previous paragraphs, in an operation cycle, the capacitor C is first charged with the second current I2 to raise the charging voltage Vramp to a certain level, which is the offset voltage Vos. The comparator COMP outputs different voltage results at the output terminal by comparing the current or voltage of the two input terminals. The charging time of the first current I1 increasing the charging voltage Vramp (received by the positive input terminal) to reach voltage level received by the negative input terminal of the comparator COMP can be reduced. It can calibrate the timing signal Ton to shorten its pulse width. When the timing signal Ton passes through the external circuit EXT, the generated delay can cause the pulse-width of the timing signal Ton to return to its preset value, so the pulse width of the deformed timing signal Ton_f is substantially equal to the preset pulse width of the timing signal Ton. This mechanism can calibrate delay or deformation of the timing signal Ton caused by the external circuit EXT, so that the high-speed circuit can operate more precisely.

Figure 5:
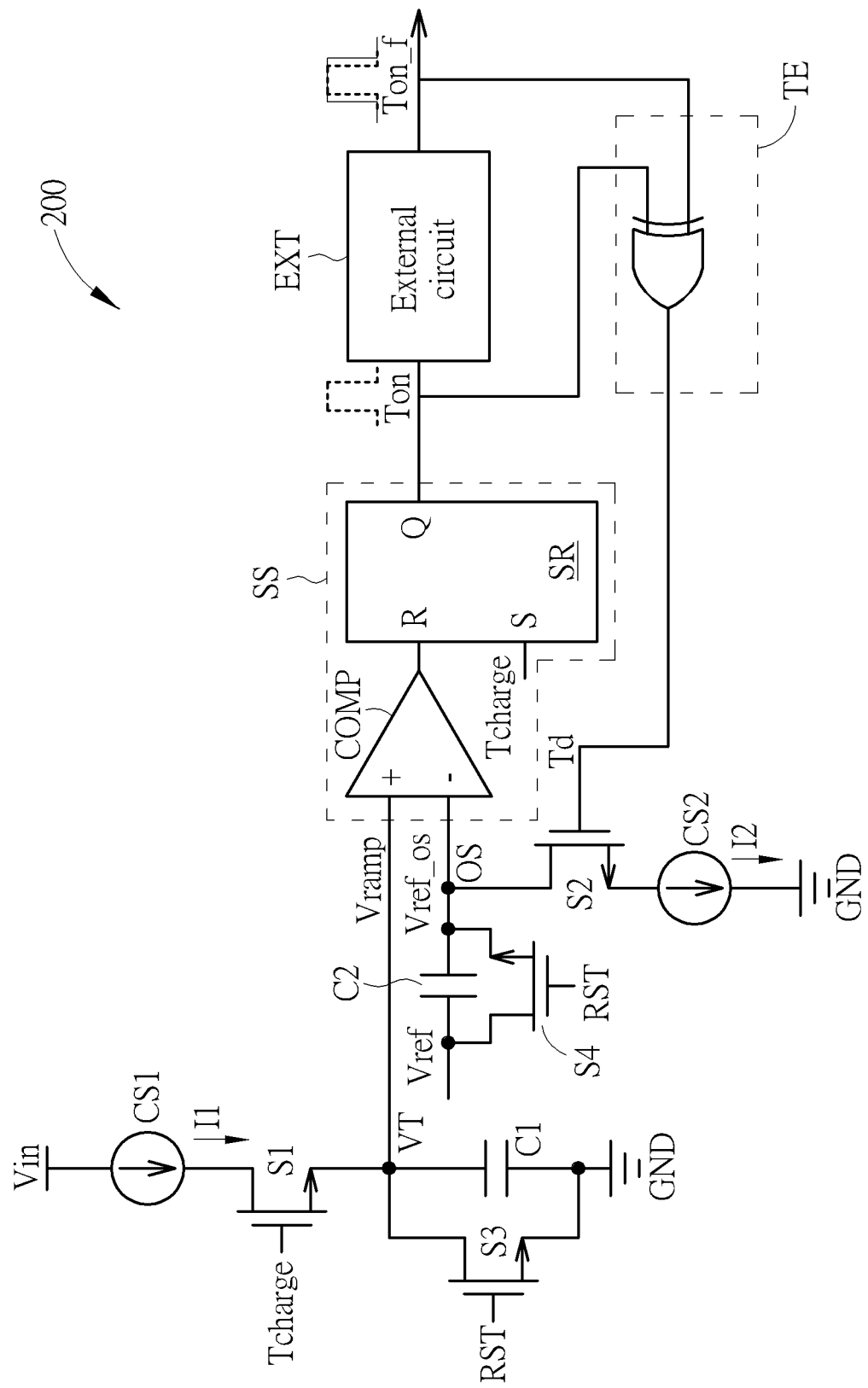
FIG. 5 is a diagram of a timing signal generator of an embodiment.

FIG. 5 is a diagram of a timing signal generator 200 of an embodiment. The timing signal generator 200 includes a first current source CS1, a first switch S1, a second switch S2, a third switch S3, a fourth switch S4, a second current source CS2, a first capacitor C1, a second capacitor C2, and a comparator COMP and timing difference extractor TE. The first current source CS1 is for generating the first current I1 according to the input voltage Vin. The first switch S1 includes a first terminal coupled to the first current source CS1, a second terminal coupled to the charging terminal VT, and a control terminal for receiving the charging signal Tcharge. The second switch S2 includes a first terminal coupled to the bias terminal OS, a second terminal, and a control terminal for receiving the timing difference signal Td. The second current source CS2 is coupled to the second terminal of the second switch S2 for generating the second current I2 according to the input voltage Vin. The third switch S3 includes a first terminal coupled to the charging terminal VT, a second terminal coupled to the ground terminal GND, and a control terminal for receiving the reset signal RST. The fourth switch S4 includes a first terminal, a second terminal coupled to the bias terminal OS, and a control terminal for receiving the reset signal RST. The first capacitor C1 is coupled between the charging terminal VT and the ground terminal GND. The first terminal of the second capacitor C2 is coupled to the bias terminal OS, and the second terminal is for receiving the reference voltage Vref. The signal synthesizer SS is coupled to the charging terminal VT for generating the timing signal Ton according to the charging voltage Vramp and the offset reference voltage Vref_os. The signal synthesizer SS includes a comparator COMP and a latch SR. The comparator COMP includes a negative input terminal coupled to the bias terminal OS for receiving the offset reference voltage Vref_os, and a positive input terminal coupled to the charging terminal VT for receiving the charging voltage Vramp. The latch SR includes a setting terminal S for receiving the charging signal Tcharge, a reset terminal R coupled to the output terminal of the comparator COMP, and an output terminal Q for outputting the timing signal Ton. The timing difference extractor TE is coupled to the output end of the signal synthesizer SS and the control end of the second switch S2, and is for generating the timing difference signal Td according to the timing signal Ton and the deformed timing signal Ton_f. The timing difference extractor TE includes a first input terminal coupled to the output terminal of the signal synthesizer SS, a second input terminal for receiving the deformed timing signal Ton_f output by the external circuit EXT, and an output terminal for outputting the timing difference signal Td.

In the embodiment, the first switch S1, the second switch S2, the third switch S3, and the fourth switch S4 can be N-type transistors, such as bipolar junction transistors (BJT), metal-oxide-semiconductor field-effect transistors (MOSFET) or fin field-effect transistor (FinFET). However, the embodiment is not limited thereto, and other types of transistors should also fall within the scope of the present invention. The timing difference extractor TE may be an XOR gate. The timing difference between the deformed timing signal Ton_f and the timing signal Ton is caused by the external circuit EXT. In other words, when the timing signal Ton passes through the external circuit EXT, the timing signal Ton may be delayed or deformed due to various interferences. The pulse width of the deformed timing signal Ton_f would different from the original. The propagation delay of the timing signal Ton may cause the falling edge of the deformed timing signal Ton_f to lag behind the falling edge of the timing signal Ton, and the activation delay of the timing signal Ton may cause the rising edge of the timing signal Ton to lag behind the rising edge of the deformed timing signal Ton_f. The clock speed of today's high-speed circuits is in the nanosecond range, thus even very short delay or deformation of the timing signal may cause different operations of the chip to be out of synchronization. Therefore, the timing difference extractor TE can be implemented to extract the timing difference between the timing signal Ton and the deformed timing signal Ton_f. The extraction result is the timing difference signal Td. As shown in FIG. 5, the timing signal generator 200 has a feedback mechanism to apply the timing difference signal Td to calibrate the delay or deformation of the timing signal Ton. Thus, the operation of the high-speed circuit can be more precise.

Figure 6:
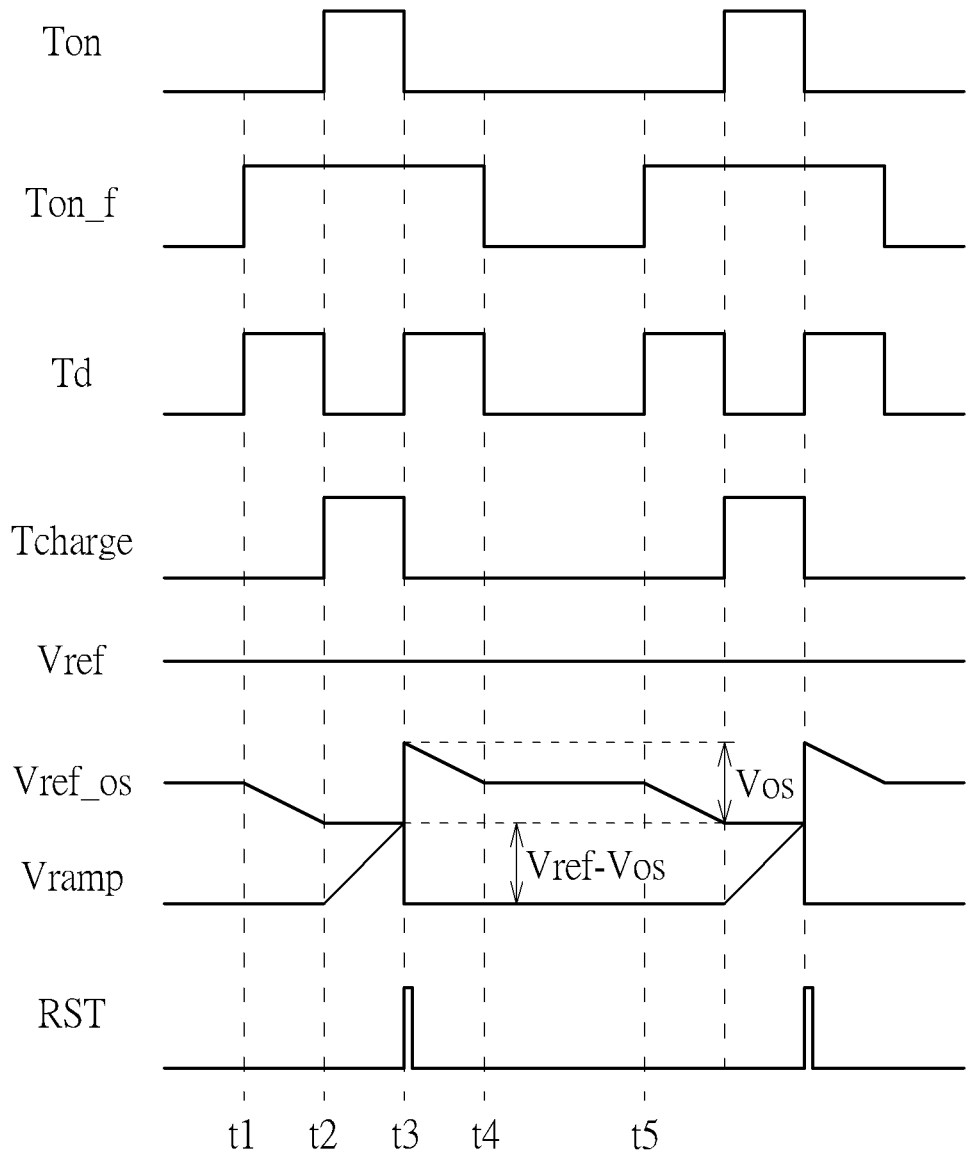
FIG. 6 is a timing diagram of the operation signals of the timing signal generator of FIG. 5.

Please refer to both FIGS. 5 and 6. FIG. 6 is a timing diagram of the operation signals of the timing signal generator 200 of FIG. 5. Between time t1 and time t2, the charging signal Tcharge is at the low level, so the first switch S1 is turned off. The level of the charging voltage Vramp is lower than the level of the reference voltage Vref, so the comparator COMP outputs the low-level signal. The latch SR simultaneously receives the low-level charging signal Tcharge and the low-level comparator COMP output signal, so the output terminal Q outputs the low-level timing signal Ton. At this time, the timing signal Ton is at the low level, and the deformed timing signal Ton_f is at the high level. The timing difference extractor TE performs XOR operation on the pulse widths of the timing signal Ton and the deformed timing signal Ton_f to generate the timing difference signal Td. Therefore, at the time t1, the timing difference signal Td is at the high level, so the second switch S2 is turned on. The second current source CS2 discharges the second capacitor C2 with the second current I2, thereby reducing the offset reference voltage Vref_os.

At time t3, the charging voltage Vramp reaches the level of the reference voltage Vref; the output signal of the comparator COMP rises to the high level, and the charging signal Tcharge falls to the low level. The latch SR simultaneously receives the low-level charging signal Tcharge and the high-level comparator COMP output signal, so that the timing signal Ton output by the output terminal Q drops to the low level, while the time difference timing signal Ton_f remains at the high level. Ideally, the pulse width of the charging signal Tcharge is substantially equal to the pulse width of the timing signal Ton. At this time, the reset signal RST, a rapid pulse signal with quick transient change in the amplitude, is activated, and the third switch S3 is turned on for a short period of time to release the charging voltage Vramp accumulated at the charging terminal VT. The charging voltage Vramp quickly drops to the low level. At the same time, the reset signal RST also turns on the fourth switch S4 for a short period of time, so the offset reference voltage Vref_os is pulled back to the level of the reference voltage Vref. And between time t3 and t4, the timing difference signal Td generated by the timing difference extractor TE rises to the high level, so the second switch S2 is turned on again. The second capacitor C2 is discharged with the second current I2, and the offset reference voltage Vref_os down shifts again.

At time t4, the time difference timing signal Ton_f falls to a low level, and the timing signal Ton maintains the low level, and the time difference signal Td generated by the time difference extractor TE falls to the low level. The low-level charging signal Tcharge turns off the first switch S1, the low-level time difference signal Td turns off the second switches S2, the first current source CS1 stops charging the first capacitor C1, and the second current source CS2 stops making the second capacitor C2 is discharged. The third switch S3 is turned off, so the offset reference voltage Vref_os is maintained at the same level.

At time t5, the timing signal generator 200 starts to generate the timing signal for the next cycle. The charging signal Tcharge maintained at the low level turns off the first switch S1. The level of the charging voltage Vramp is lower than the level of the reference voltage Vref, so the comparator COMP outputs the low-level signal. The latch SR simultaneously receives the low-level charging signal Tcharge and the low-level comparator COMP output signal, so output terminal Q outputs the low-level timing signal Ton. At this time, the timing signal Ton is at the low level, and the timing difference timing signal Ton_f is at the high level. The timing difference extractor TE performs XOR operation on the pulse width between the timing signal Ton and the timing difference timing signal Ton_f to generate the timing difference signal Td. Therefore, at time t5, the timing difference signal Td is at the high level, and the second switch S2 is turned on. The second current source CS2 discharges the second capacitor C2 with the second current I2, so the offset reference voltage Vref_os starts to drop from the previous level. The subsequent operation process repeats the process during time t1 to t4 and is not repeated here. In this way, the timing signal generator 200 can consistently generate the timing signal Ton in each cycle according to circuit functions and requirements.

The pulse width of the timing signal Ton can be calibrated by the following formula:

$$I2 \times Td = C \times Vos$$

$$Vos = \frac{I2 \times Td}{C} = Vref - Vref\_os$$

$$I1 \times Ton = C \times (Vref\_os) = C \times (Vref - Vos)$$

$$Ton = \frac{C \times (Vref - Vos)}{I1} = \frac{C \times \left(Vref - \frac{I2 \times Td}{C}\right)}{I1} = \frac{C \times Vref}{I1} - Td$$

$$Ton\_f = Ton + Td = \frac{C \times Vref}{I1}$$

I1 is the first current. I2 is the second current. C is the capacitance of the first capacitor C1 and the second capacitor C2, where the capacitance of the first capacitor C1 is substantially equal to the capacitance of the second capacitor C2. Td represents the pulse width of the timing difference signal. Ton represents the pulse width of the timing signal. Ton_f represents the pulse width of the deformed timing signal. Vos is the offset voltage, and Vref is the reference voltage. The offset voltage Vos, as indicated in FIG. 6, is the voltage at which the second current source CS2 discharges the second capacitor C2 with the second current I2, reducing the reference voltage Vref. The magnitude of the voltage drop after discharging is represented by Vref-Vos.

As described in the previous paragraphs, in an operation cycle, the second capacitor C2 is firstly discharged by the second current I2, so the reference voltage Vref is lowered to a level which is the offset reference voltage Vref_os. The comparator COMP outputs different voltage results at the output terminal by comparing the current or voltage of the two input terminals. The charging time of the first current I1 increasing the charging voltage Vramp (received by the positive input terminal) to reach voltage level received by the negative input terminal of the comparator COMP can be reduced. It can calibrate the timing signal Ton to shorten its pulse width. When the timing signal Ton passes through the external circuit EXT, the generated delay can cause the pulse-width of the timing signal Ton to return to its preset value, so the pulse width of the deformed timing signal Ton_f is substantially equal to the preset pulse width of the timing signal Ton. This mechanism can calibrate delay or deformation of the timing signal Ton caused by the external circuit EXT, so that the high-speed circuit can operate more precisely.

Figure 7:
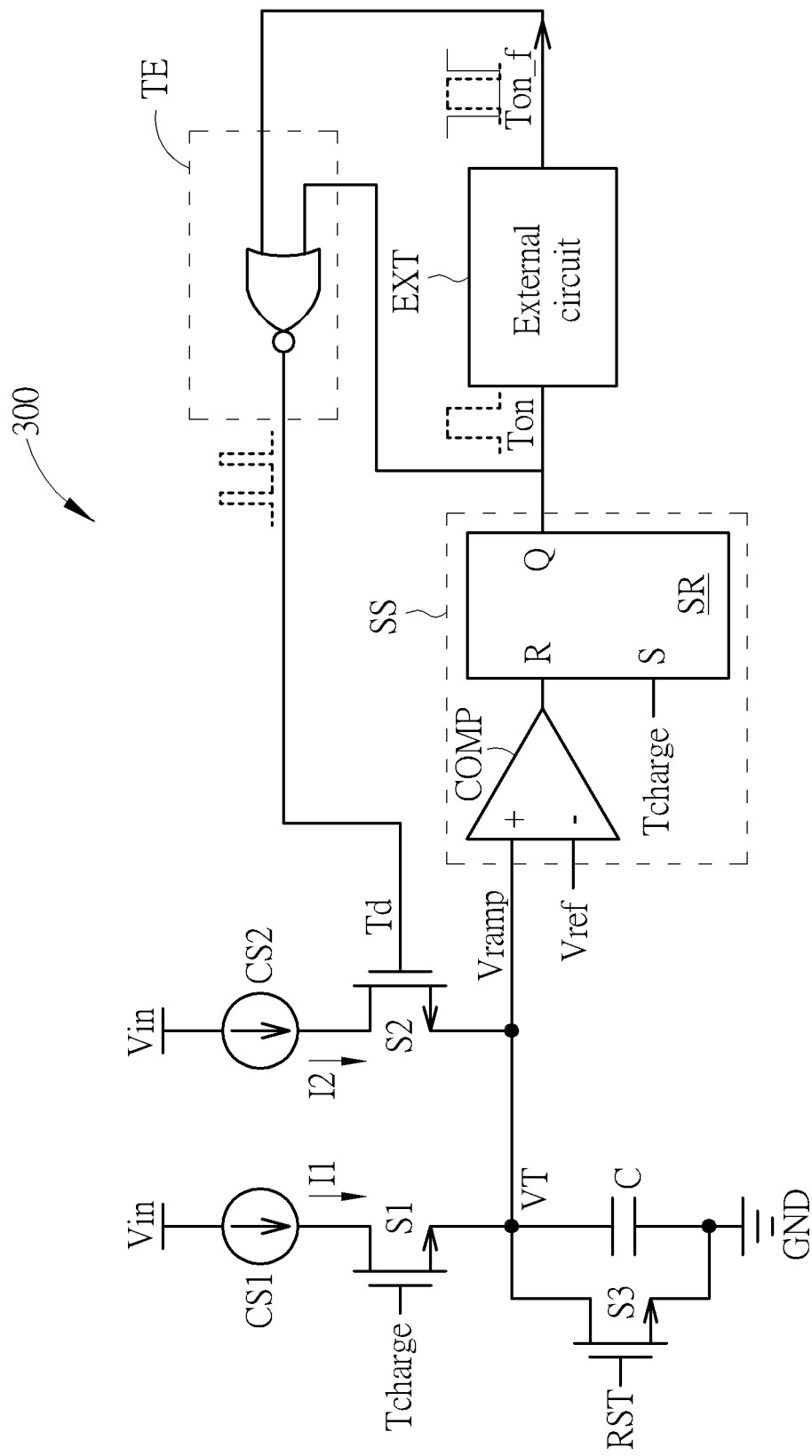
FIG. 7 is a diagram of a timing signal generator of an embodiment.

FIG. 7 is a diagram of a timing signal generator 300 of an embodiment. The circuit configuration of the timing signal generator 300 is similar to that of the timing signal generator 100. The difference is that the phase of the deformed timing signal Ton_f caused by the external circuit EXT is opposite to the phase of the timing signal Ton. Thus, the timing difference extractor TE of the timing signal generator 300 can be a NOR gate instead. The rest of the circuit configuration is the same as that of the timing signal generator 100 and the description is not repeated herein.

Figure 8:
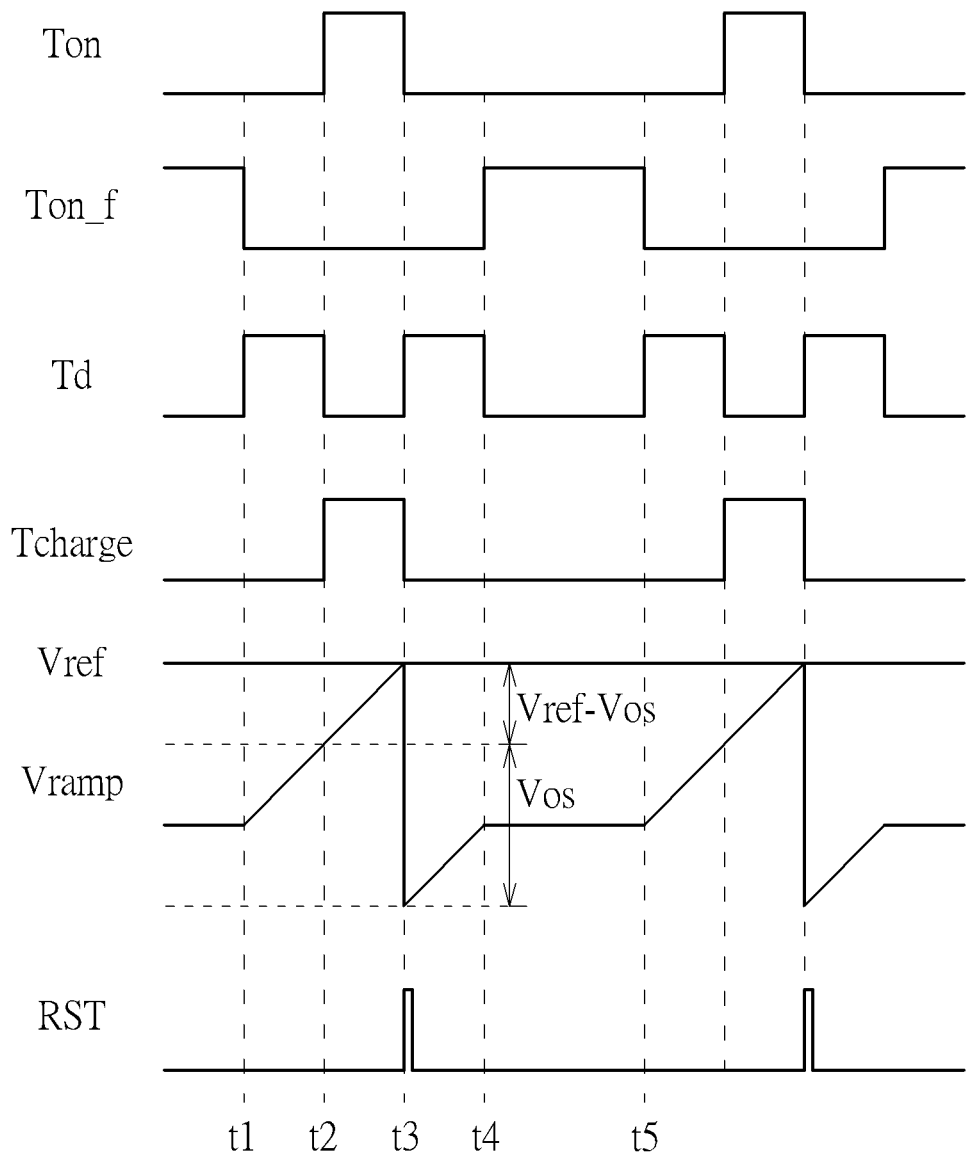
FIG. 8 is a timing diagram of the operation signals of the timing signal generator of FIG. 7.

FIG. 8 is a timing diagram of the operation signals of the timing signal generator 300 of FIG. 7. The operation signals of the timing signal generator 300 are similar to the operation signals of the timing signal generator 100. The difference is that the phase of the deformed timing signal Ton_f of the timing signal generator 300 is opposite in phase to the deformed timing signal Ton_f of the timing signal generator 100. Thus, the timing difference extractor TE performs NOR operation on the pulse width of the timing signal Ton and the deformed timing signal Ton_f to generate the timing difference signal Td. The timing difference signal Td of the timing signal generator 300 and the timing difference signal Td of the timing signal generator 100 are the same phase. The rest of the operation signals are the same as the operation signals of the timing signal generator 100.

In more detail, between time t1 and time t2, the charging signal Tcharge is at the low level, so the first switch S1 is turned off. The charging voltage Vramp is lower than the reference voltage Vref, so the comparator COMP outputs the low-level signal. The latch SR simultaneously receives the low-level charging signal Tcharge and the low-level output signal of the comparator COMP, so the output terminal Q outputs the low-level timing signal Ton. At this time, the timing signal Ton is at the low level, and the deformed timing signal Ton_f is at the high level. The timing difference extractor TE performs NOR operation on the pulse widths of the timing signal Ton and the deformed timing signal Ton_f to generate the timing difference signal Td. Therefore, between the times t1 and t2, the timing difference signal Td is at the high level, making the second switch S2 to turned on. The second current source CS2 charges the capacitor C with the second current I2 to increase the charging voltage Vramp.

Between time t2 and t3, the charging signal Tcharge rises to the high level, and the latch SR simultaneously receives the high-level charging signal Tcharge and the low-level output signal from comparator COMP, so the timing signal Ton is raised to the high level. At this time, the timing signal Ton is at the high level, and the deformed timing signal Ton_f is also at the high level. The timing difference extractor TE performs NOR operation on the pulse widths of the timing signal Ton and the deformed timing signal Ton_f to obtain a timing difference signal Td, thus the timing difference signal Td generated by the timing difference extractor TE will be reduced to the low level. The high-level charging signal Tcharge turns on the first switch S1, and the low-level timing difference signal Td turns off the second switch S2. The second current source CS2 stops charging the capacitor C, and at the same time the first current source CS1 starts to charge the capacitor C with the first current I1, thus increasing the charging voltage Vramp.

At time t3, the charging voltage Vramp reaches the level of the reference voltage Vref; the output signal of the comparator COMP rises to the high level, and the charging signal Tcharge falls to the low level. The latch SR simultaneously receives the low-level charging signal Tcharge and the high-level output signal of comparator COMP, so that the timing signal Ton output by the output terminal Q drops to the low level, while the deformed timing signal Ton_f remains at the high level. Ideally, the pulse width of the charging signal Tcharge should be substantially equal to the pulse width of the timing signal Ton. At this time, the reset signal RST is activated, and the third switch S3 is turned on for a short period of time to release the charging voltage Vramp accumulated at the charging terminal VT. As the result, the charging voltage Vramp quickly drops to the low level. And between time t3 and time t4, the timing difference signal Td generated by the timing difference extractor TE through the above-mentioned operation rises to the high level, so the second switch S2 is turned on again; the capacitor C is charged with the second current I2, and the charging voltage Vramp rises again.

At time t4, the deformed timing signal Ton_f drops to the low level; the timing signal Ton maintains at the low level, and the timing difference signal Td generated by the timing difference extractor TE drops to the low level. The low-level charging signal Tcharge turns off the first switch S1, and the low-level timing difference signal Td turns off the second switch S2. Both the first current source CS1 and the second current source CS2 stop charging the capacitor C. The third switch S3 is in turned off, so the charging voltage Vramp is maintained at the same level. The rest of the operation process repeats time t1 to t4, and the description is not repeated here.

Figure 9:
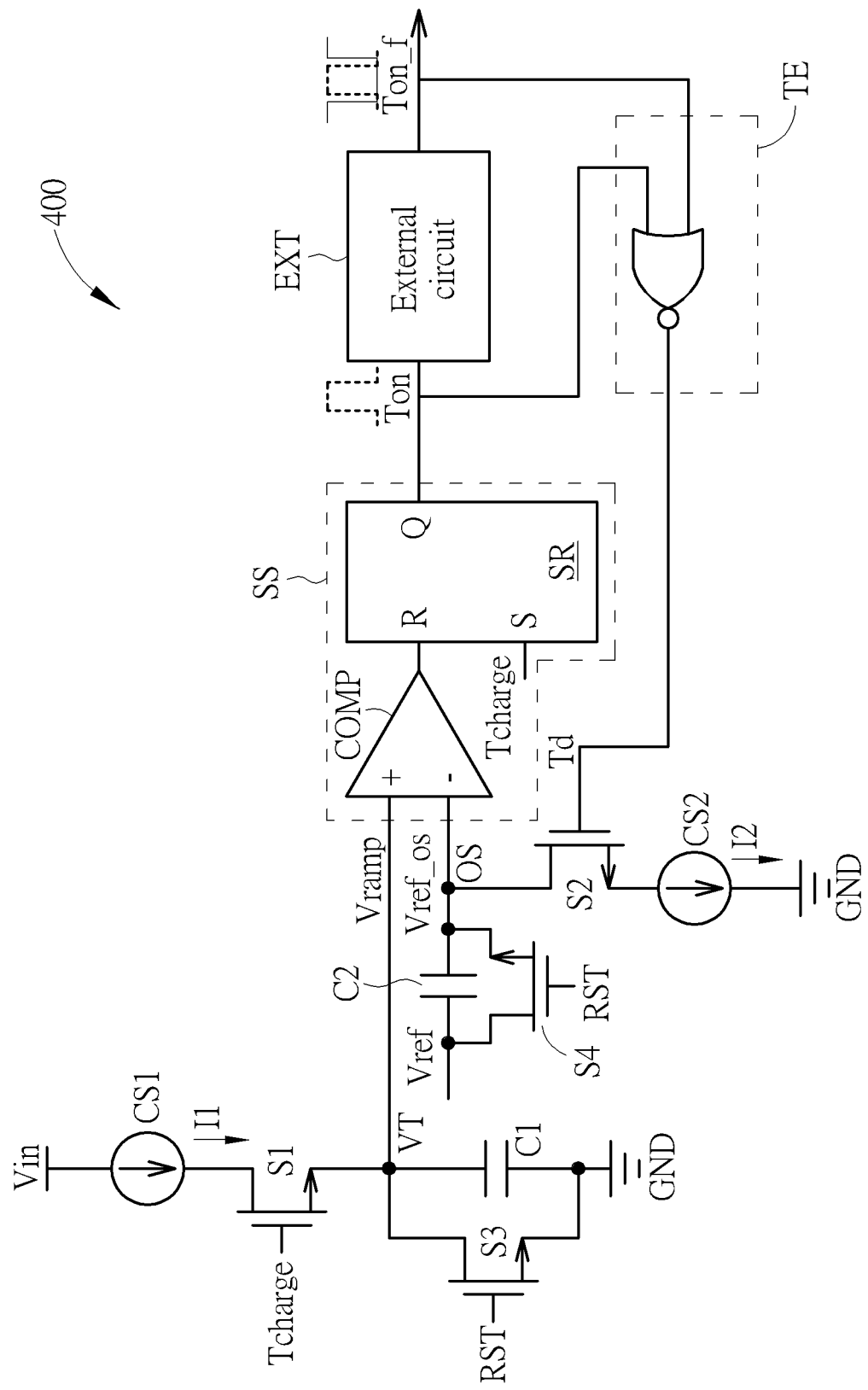
FIG. 9 is a diagram of a timing signal generator of an embodiment.

FIG. 9 is a diagram of a timing signal generator 400 of an embodiment. The circuit configuration of the timing signal generator 400 is similar to that of the timing signal generator 200. The difference is that the phase of the deformed timing signal Ton_f caused by the external circuit EXT is opposite to the phase of the timing signal Ton. Thus, the timing difference extractor TE of the timing signal generator 400 can be a NOR gate instead. The rest of the circuit configuration is the same as that of the timing signal generator 200 and the description is not repeated herein.

Figure 10:
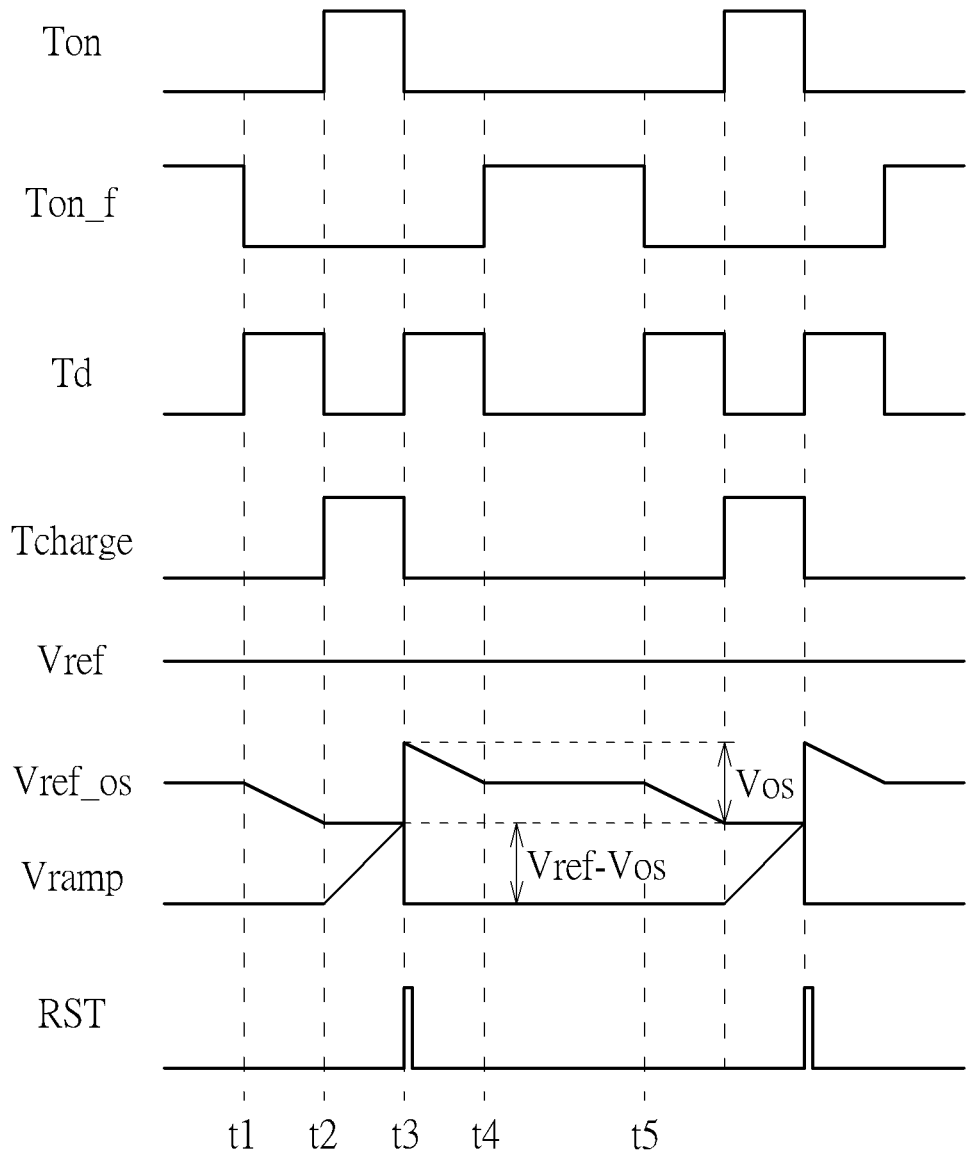
FIG. 10 is a timing diagram of the operation signals of the timing signal generator of FIG. 9.

FIG. 10 is a timing diagram of the operation signals of the timing signal generator 400 of FIG. 9. The operation signals of the timing signal generator 400 are similar to the operation signals of the timing signal generator 200. The difference is that the phase of the deformed timing signal Ton_f of the timing signal generator 400 is opposite in phase to the deformed timing signal Ton_f of the timing signal generator 200. Thus, the timing difference extractor TE performs NOR operation on the pulse width of the timing signal Ton and the deformed timing signal Ton_f to generate the timing difference signal Td. The timing difference signal Td of the timing signal generator 400 and the timing difference signal Td of the timing signal generator 200 are the same phase. The rest of the operation signals are the same as the operation signals of the timing signal generator 200.

In more detail, between time t1 and time t2, the charging signal Tcharge is at the low level, so the first switch S1 is turned off. The level of the charging voltage Vramp is lower than the level of the reference voltage Vref, so the comparator COMP outputs the low-level signal. The latch SR simultaneously receives the low-level charging signal Tcharge and the low-level comparator COMP output signal, so the output terminal Q outputs the low-level timing signal Ton. At this time, the timing signal Ton is at the low level, and the deformed timing signal Ton_f is at the high level. The timing difference extractor TE performs NOR operation on the pulse widths of the timing signal Ton and the deformed timing signal Ton_f to generate the timing difference signal Td. Therefore, at the time t1, the timing difference signal Td is at the high level, so the second switch S2 is turned on. The second current source CS2 discharges the second capacitor C2 with the second current I2, thereby reducing the offset reference voltage Vref_os.

At time t3, the charging voltage Vramp reaches the level of the reference voltage Vref; the output signal of the comparator COMP rises to the high level, and the charging signal Tcharge falls to the low level. The latch SR simultaneously receives the low-level charging signal Tcharge and the high-level comparator COMP output signal, so that the timing signal Ton output by the output terminal Q drops to the low level, while the time difference timing signal Ton_f remains at the high level. Ideally, the pulse width of the charging signal Tcharge is substantially equal to the pulse width of the timing signal Ton. At this time, the reset signal RST is activated, and the third switch S3 is turned on for a short period of time to release the charging voltage Vramp accumulated at the charging terminal VT. The charging voltage Vramp quickly drops to the low level. At the same time, the reset signal RST also turns on the fourth switch S4 for a short period of time, so the offset reference voltage Vref_os is pulled back to the level of the reference voltage Vref. And between time t3 and t4, the timing difference signal Td generated by the timing difference extractor TE rises to the high level, so the second switch S2 is turned on again. The second capacitor C2 is discharged with the second current I2, and the offset reference voltage Vref_os down shifts again.

At time t4, the time difference timing signal Ton_f falls to a low level, and the timing signal Ton maintains the low level, and the time difference signal Td generated by the time difference extractor TE falls to the low level. The low-level charging signal Tcharge turns off the first switch S1, the low-level time difference signal Td turns off the second switches S2, the first current source CS1 stops charging the first capacitor C1, and the second current source CS2 stops making the second capacitor C2 is discharged. The third switch S3 is turned off, so the offset reference voltage Vref_os is maintained at the same level. The rest of the operation process repeats time t1 to t4, and the description is not repeated here.

Figure 11:
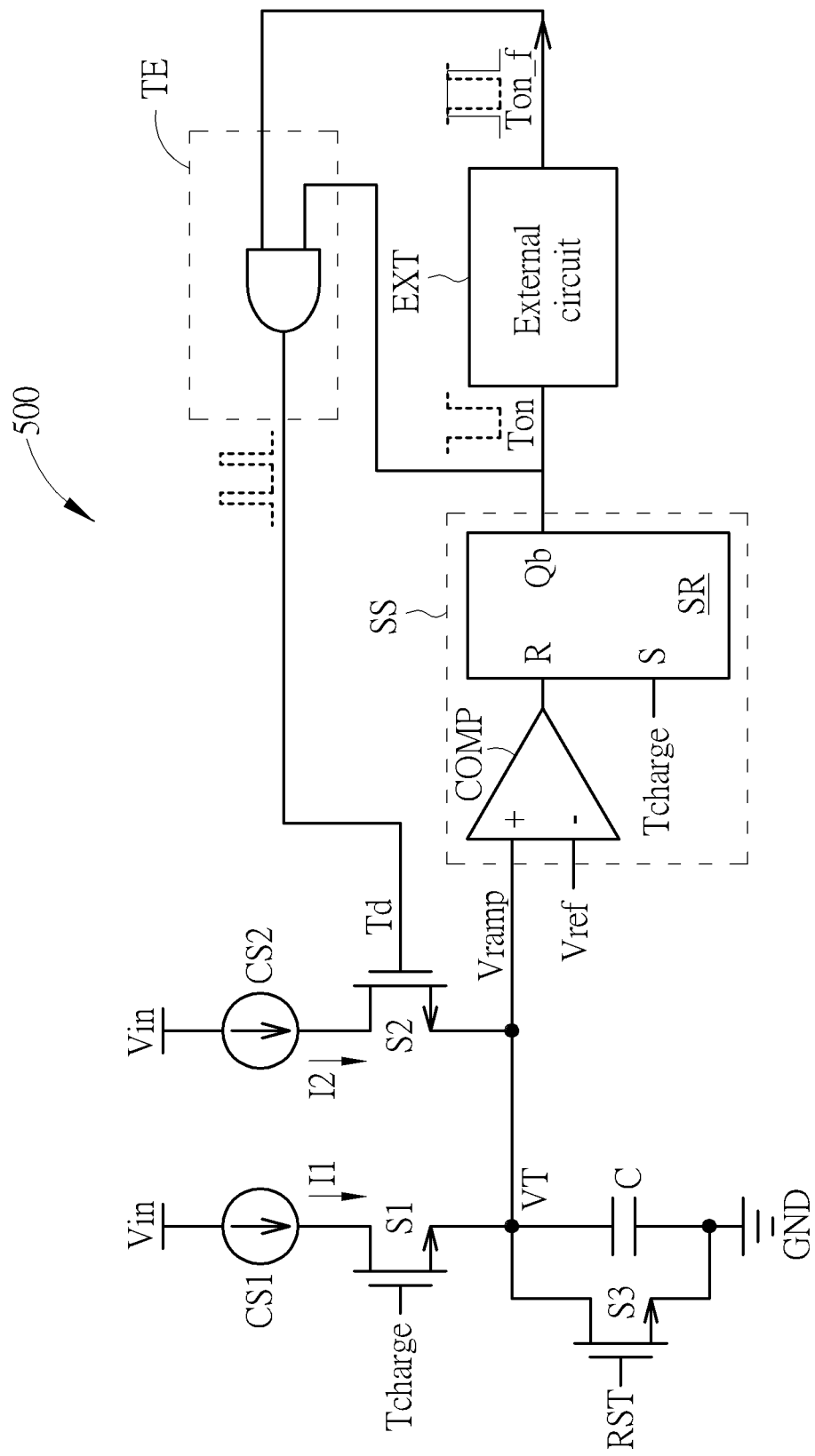
FIG. 11 is a diagram of a timing signal generator of an embodiment.

FIG. 11 is a diagram of a timing signal generator 500 of an embodiment. The circuit configuration of the timing signal generator 500 is similar to that of the timing signal generator 100. The difference is that the output terminal Qb of the latch SR of the timing signal generator 500 can output the inverted timing signal Ton, so the timing signal Ton generated by the timing signal generator 500 and the timing signal Ton generated by the timing signal generator 100 are opposite in phase. The deformed timing signal Ton_f caused by the external circuit EXT is opposite in phase to the timing signal Ton. Therefore, the timing difference extractor TE of the timing signal generator 500 can be replaced by an AND gate instead. The rest of the components of the timing signal generator 500 are the same as the timing signal generator 100 and the description is not be described herein.

Figure 12:
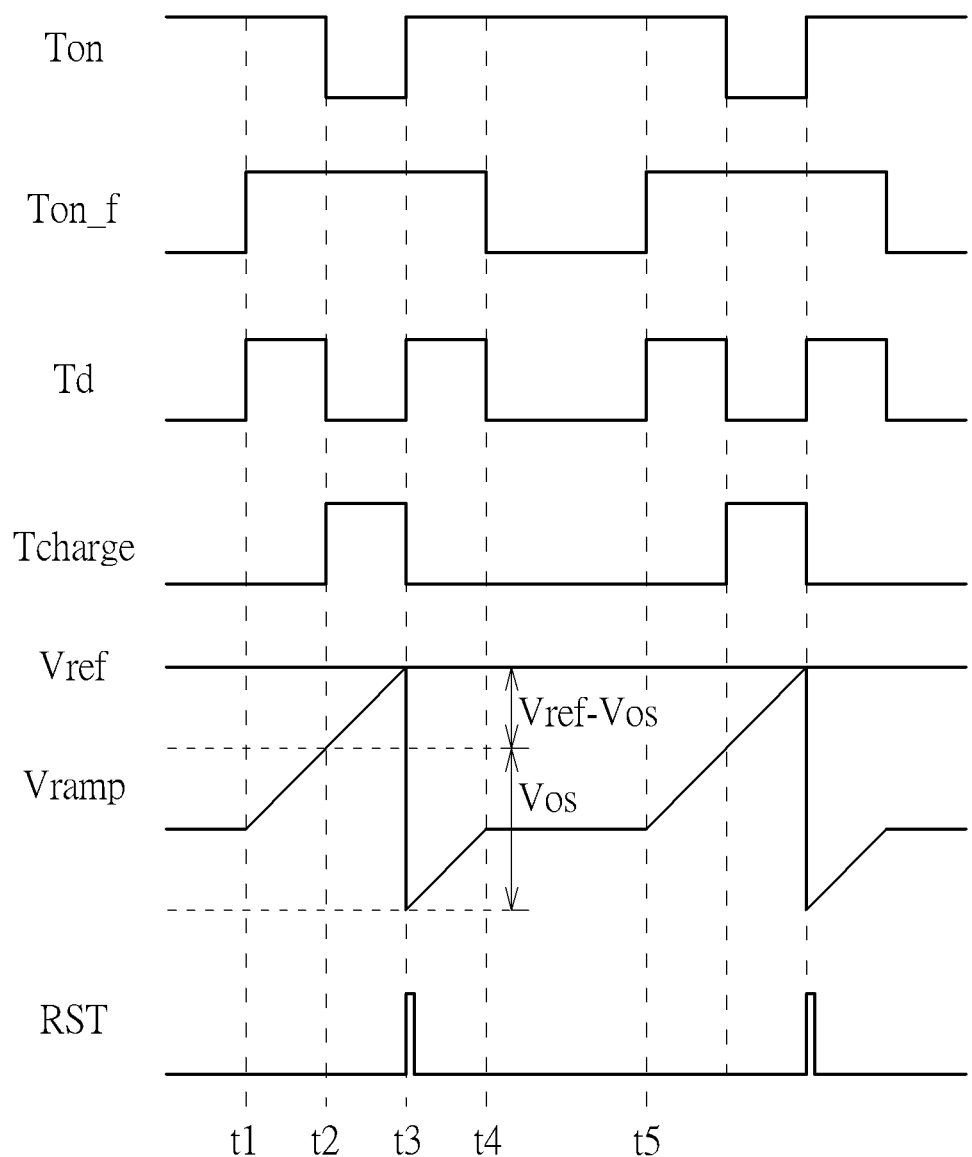
FIG. 12 is a timing diagram of the operation signals of the timing signal generator of FIG. 11.

FIG. 12 is a timing diagram of operation signals of the timing signal generator 500 of FIG. 11. The operation signals of the timing signal generator 500 are similar to the operation signals of the timing signal generator 100. The difference is that the timing signal Ton of the timing signal generator 500 is opposite in phase to the timing signal Ton of the timing signal generator 100. The timing difference extractor TE performs AND operation on the pulse widths of the timing signal Ton and the deformed timing signal Ton_f to generate the timing difference signal Td. The timing difference signal Td of the timing signal generator 500 is the identical in phase to the timing difference signal Td of the timing signal generator 100.

In more detail, between time t1 and time t2, the charging signal Tcharge is at the low level, so the first switch S1 is turned off. The charging voltage Vramp is lower than the reference voltage Vref, so the comparator COMP outputs the low-level signal. The latch SR simultaneously receives the low-level charging signal Tcharge and the low-level output signal of the comparator COMP, so the output terminal Q outputs the low-level timing signal Ton. At this time, the timing signal Ton is at the low level, and the deformed timing signal Ton_f is at the high level. The timing difference extractor TE performs AND operation on the pulse widths of the timing signal Ton and the deformed timing signal Ton_f to generate the timing difference signal Td. Therefore, between the times t1 and t2, the timing difference signal Td is at the high level, making the second switch S2 to turned on. The second current source CS2 charges the capacitor C with the second current I2 to increase the charging voltage Vramp.

Between time t2 and t3, the charging signal Tcharge rises to the high level, and the latch SR simultaneously receives the high-level charging signal Tcharge and the low-level output signal from comparator COMP, so the timing signal Ton is raised to the high level. At this time, the timing signal Ton is at the high level, and the deformed timing signal Ton_f is also at the high level. The timing difference extractor TE performs AND operation on the pulse widths of the timing signal Ton and the deformed timing signal Ton_f to obtain a timing difference signal Td, thus the timing difference signal Td generated by the timing difference extractor TE will be reduced to the low level. The high-level charging signal Tcharge turns on the first switch S1, and the low-level timing difference signal Td turns off the second switch S2. The second current source CS2 stops charging the capacitor C, and at the same time the first current source CS1 starts to charge the capacitor C with the first current I1, thus increasing the charging voltage Vramp.

At time t3, the charging voltage Vramp reaches the level of the reference voltage Vref; the output signal of the comparator COMP rises to the high level, and the charging signal Tcharge falls to the low level. The latch SR simultaneously receives the low-level charging signal Tcharge and the high-level output signal of comparator COMP, so that the timing signal Ton output by the output terminal Q drops to the low level, while the deformed timing signal Ton_f remains at the high level. Ideally, the pulse width of the charging signal Tcharge should be substantially equal to the pulse width of the timing signal Ton. At this time, the reset signal RST is activated, and the third switch S3 is turned on for a short period of time to release the charging voltage Vramp accumulated at the charging terminal VT. As the result, the charging voltage Vramp quickly drops to the low level. And between time t3 and time t4, the timing difference signal Td generated by the timing difference extractor TE through the above-mentioned operation rises to the high level, so the second switch S2 is turned on again; the capacitor C is charged with the second current I2, and the charging voltage Vramp rises again.

At time t4, the deformed timing signal Ton_f drops to the low level; the timing signal Ton maintains at the low level, and the timing difference signal Td generated by the timing difference extractor TE drops to the low level. The low-level charging signal Tcharge turns off the first switch S1, and the low-level timing difference signal Td turns off the second switch S2. Both the first current source CS1 and the second current source CS2 stop charging the capacitor C. The third switch S3 is in turned off, so the charging voltage Vramp is maintained at the same level. The rest of the operation process repeats time t1 to t4, and the description is not repeated here.

Figure 13:
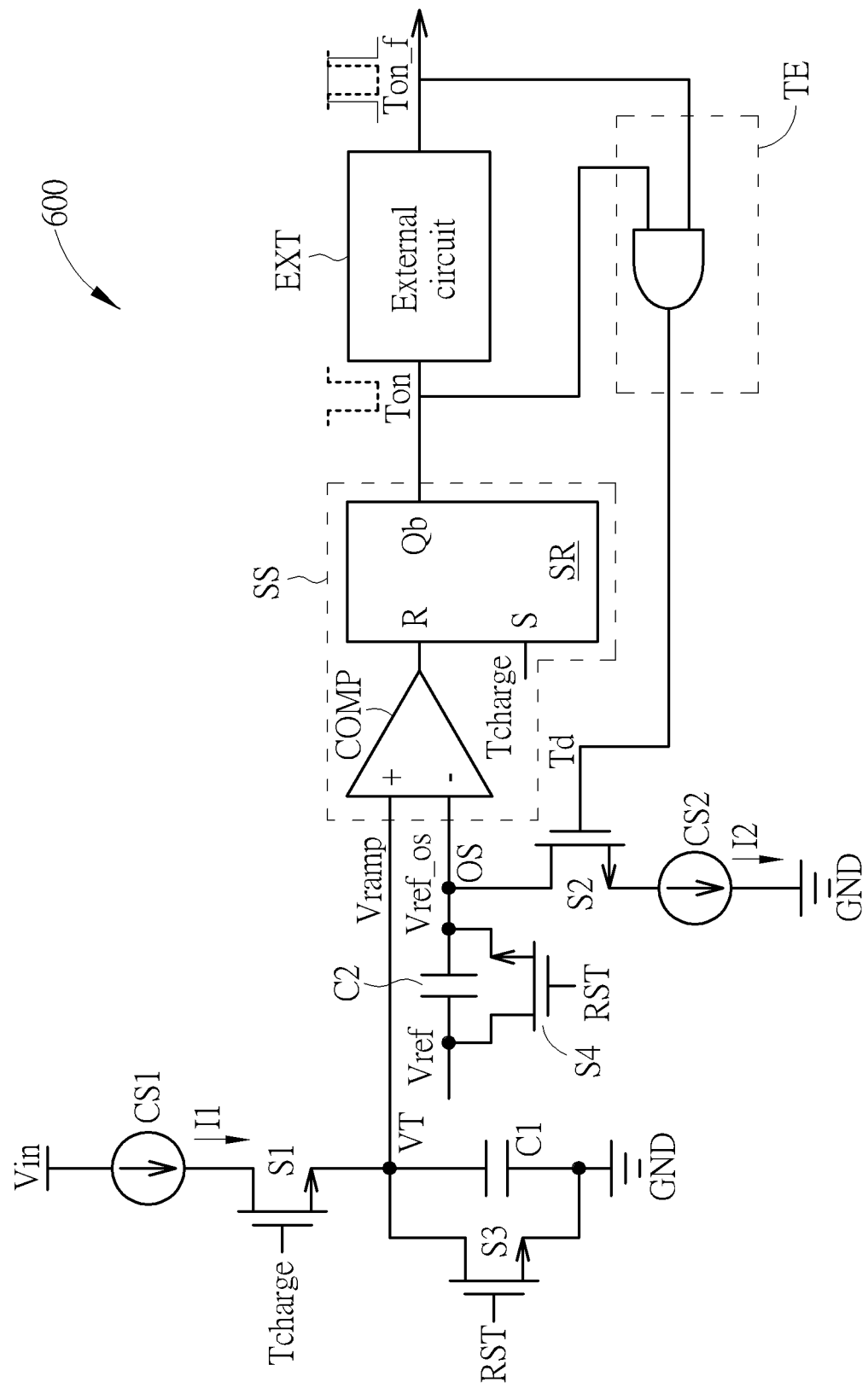
FIG. 13 is a diagram of a timing signal generator of an embodiment.

FIG. 13 is a diagram of a timing signal generator 600 of an embodiment. The circuit configuration of the timing signal generator 600 is similar to that of the timing signal generator 200. The difference is that the output terminal Qb of the latch SR of the timing signal generator 600 can output the inverted timing signal Ton, so the timing signal Ton generated by the timing signal generator 600 and the timing signal Ton generated by the timing signal generator 200 are opposite in phase. The deformed timing signal Ton_f caused by the external circuit EXT is opposite in phase to the timing signal Ton. Therefore, the timing difference extractor TE of the timing signal generator 600 can be replaced by an AND gate instead. The rest of the components of the timing signal generator 600 are the same as the timing signal generator 200 and the description is not be described herein.

Figure 14:
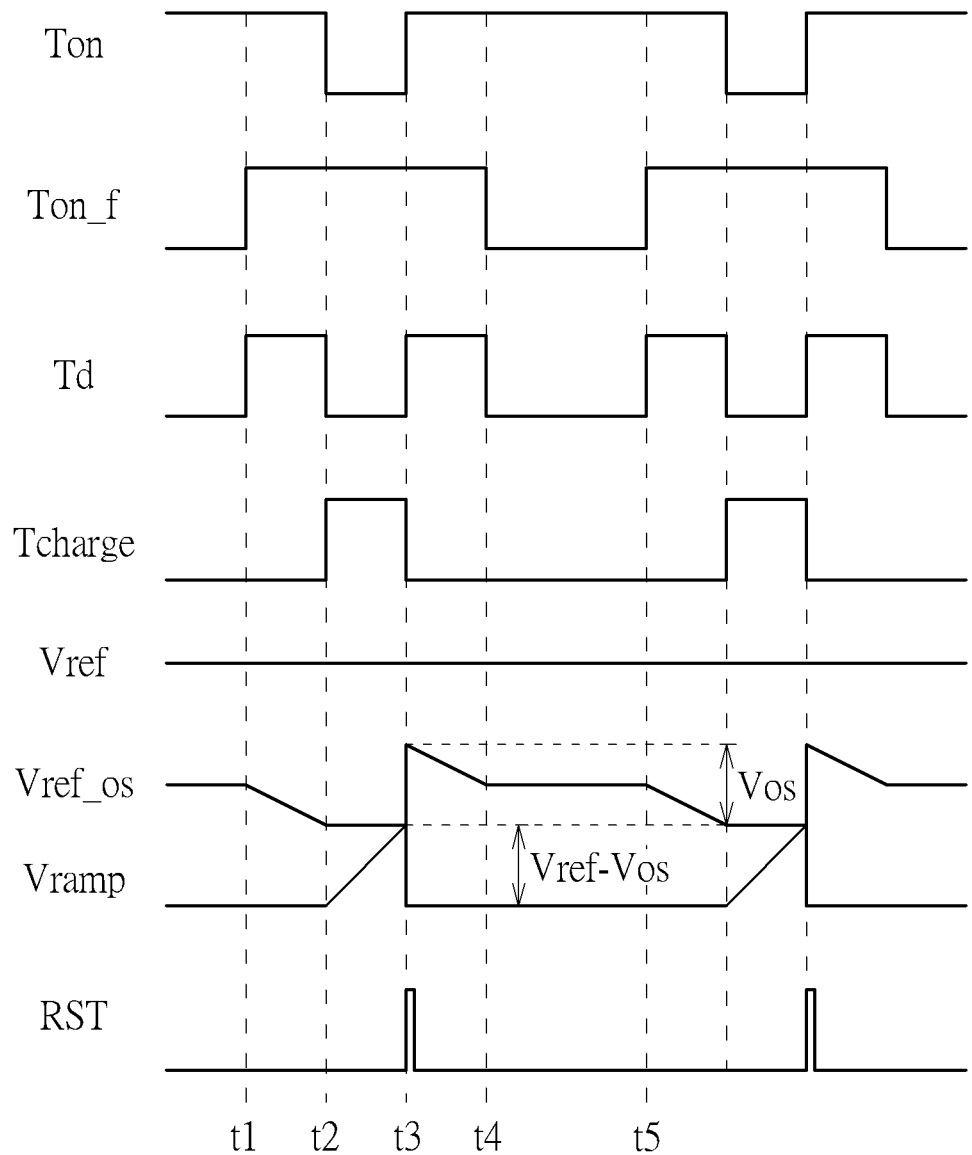
FIG. 14 is a timing diagram of the operation signals of the timing signal generator of FIG. 13.

FIG. 14 is a timing diagram of operation signals of the timing signal generator 600 of FIG. 13. The operation signals of the timing signal generator 600 are similar to the operation signals of the timing signal generator 200. The difference is that the timing signal Ton of the timing signal generator 600 is opposite in phase to the timing signal Ton of the timing signal generator 200. The timing difference extractor TE performs AND operation on the pulse widths of the timing signal Ton and the deformed timing signal Ton_f to generate the timing difference signal Td. The timing difference signal Td of the timing signal generator 600 is the identical in phase to the timing difference signal Td of the timing signal generator 200.

In more detail, between time t1 and time t2, the charging signal Tcharge is at the low level, so the first switch S1 is turned off. The level of the charging voltage Vramp is lower than the level of the reference voltage Vref, so the comparator COMP outputs the low-level signal. The latch SR simultaneously receives the low-level charging signal Tcharge and the low-level comparator COMP output signal, so the output terminal Q outputs the low-level timing signal Ton. At this time, the timing signal Ton is at the low level, and the deformed timing signal Ton_f is at the high level. The timing difference extractor TE performs AND operation on the pulse widths of the timing signal Ton and the deformed timing signal Ton_f to generate the timing difference signal Td. Therefore, at the time t1, the timing difference signal Td is at the high level, so the second switch S2 is turned on. The second current source CS2 discharges the second capacitor C2 with the second current I2, thereby reducing the offset reference voltage Vref_os.

At time t3, the charging voltage Vramp reaches the level of the reference voltage Vref; the output signal of the comparator COMP rises to the high level, and the charging signal Tcharge falls to the low level. The latch SR simultaneously receives the low-level charging signal Tcharge and the high-level comparator COMP output signal, so that the timing signal Ton output by the output terminal Q drops to the low level, while the time difference timing signal Ton_f remains at the high level. Ideally, the pulse width of the charging signal Tcharge is substantially equal to the pulse width of the timing signal Ton. At this time, the reset signal RST is activated, and the third switch S3 is turned on for a short period of time to release the charging voltage Vramp accumulated at the charging terminal VT. The charging voltage Vramp quickly drops to the low level. At the same time, the reset signal RST also turns on the fourth switch S4 for a short period of time, so the offset reference voltage Vref_os is pulled back to the level of the reference voltage Vref. And between time t3 and t4, the timing difference signal Td generated by the timing difference extractor TE rises to the high level, so the second switch S2 is turned on again. The second capacitor C2 is discharged with the second current I2, and the offset reference voltage Vref_os down shifts again.

At time t4, the time difference timing signal Ton_f falls to a low level, and the timing signal Ton maintains the low level, and the time difference signal Td generated by the time difference extractor TE falls to the low level. The low-level charging signal Tcharge turns off the first switch S1, the low-level time difference signal Td turns off the second switches S2, the first current source CS1 stops charging the first capacitor C1, and the second current source CS2 stops making the second capacitor C2 is discharged. The third switch S3 is turned off, so the offset reference voltage Vref_os is maintained at the same level. The rest of the operation process repeats time t1 to t4, and the description is not repeated here.

In summary, the timing signal generator of the embodiments of the present invention can calibrate the timing signals to shorten the pulse width. When the timing signal passes through the external circuit, the generated delay can be applied to calibrate the timing signal. As the result the pulse width of the deformed timing signal is substantially equal to the preset pulse width of the timing signal. With this mechanism, the delay or deformation of the timing signal caused by the external circuit can be correctly calibrated, so that the high-speed circuit can operate more precisely.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A timing generator comprising:
a first current source configured to generate a first current according to an input voltage;
a first switch, comprising:
a first terminal coupled to the first current source;
a second terminal coupled to a charging terminal; and
a control terminal configured to receive a charging signal;
a second current source configured to generate a second current according to the input voltage;
a second switch, comprising:
a first terminal coupled to the second current source;
a second terminal coupled to the charging terminal; and
a control terminal configured to receive a timing difference signal;
a third switch, comprising:
a first terminal coupled to the charging terminal;
a second terminal coupled to a ground terminal; and
a control terminal configured to receive a reset signal;
a capacitor coupled between the charging terminal and the ground terminal;
a signal synthesizer coupled to the charging terminal, and configured to generate a timing signal according to a charging voltage and a reference voltage; and
a timing difference extractor coupled to the signal synthesizer and the control terminal of the second switch, and configured to generate the timing difference signal according to the timing signal and a deformed timing signal.

2. The timing generator of claim 1, wherein the signal synthesizer comprises:
a comparator, comprising:
a negative input terminal configured to receive the reference voltage;
a positive input terminal coupled to the charging terminal, and configured to receive a charging voltage; and
an output terminal; and
a latch, comprising:
a set terminal configured to receive the charging signal;
a reset terminal coupled to the output terminal of the comparator; and
an output terminal configured to output the timing signal.

3. The timing generator of claim 1, wherein the timing difference extractor comprises:

a first input terminal coupled to an output terminal of the signal synthesizer;

a second input terminal configured to receive the deformed timing signal; and an output terminal configured to output the timing difference signal.

4. The timing generator of claim 3, wherein the timing difference extractor is an XOR gate.

5. The timing generator of claim 3, wherein the timing difference extractor is an NOR gate.

6. The timing generator of claim 3, wherein the timing difference extractor is an AND gate.

7. The timing generator of claim 1, wherein:

the timing difference between the deformed timing signal and the timing signal is generated by an external circuit; and a pulse width of the timing signal is greater than a pulse width of the timing difference signal.

8. The timing generator of claim 1, wherein a current value of the first current is substantially equal to a current value of the second current.

9. The timing generator of claim 1, wherein the first switch, the second switch and the third switch are N-type transistors.

10. A timing generator comprising:

a first current source configured to generate a first current according to an input voltage;

a first switch, comprising:
 a first terminal coupled to the first current source;
 a second terminal coupled to a charging terminal; and
 a control terminal configured to receive a charging signal;

a second switch, comprising:
 a first terminal coupled to a bias terminal;
 a second terminal; and
 a control terminal configured to receive a timing difference signal;

a second current source coupled to the second terminal of the second switch, and configured to generate a second current according to the input voltage;

a third switch, comprising:
 a first terminal coupled to the charging terminal;
 a second terminal coupled to a ground terminal; and
 a control terminal configured to receive a reset signal;

a fourth switch, comprising:
 a first terminal;
 a second terminal coupled to the bias terminal; and
 a control terminal configured to receive the reset signal;

a first capacitor coupled between the charging terminal and the ground terminal;

a second capacitor coupled between the bias terminal and the first terminal of the fourth switch;

a signal synthesizer coupled to the charging terminal, and configured to generate a timing signal according to a charging voltage and an offset reference voltage; and a timing difference extractor coupled to the signal synthesizer and the control terminal of the second switch, and configured to generate the timing difference signal according to the timing signal and a deformed timing signal.

11. The timing generator of claim 10, wherein the signal synthesizer comprises:

a comparator, comprising:
 a negative input terminal coupled to the bias terminal, and configured to receive the offset reference voltage;
 a positive input terminal coupled to the charging terminal, and configured to receive a charging voltage; and
 an output; terminal; and a latch, comprising:
 a set terminal configured to receive the charging signal;
 a reset terminal coupled to the output terminal of the comparator; and
 an output terminal configured to output the timing signal.

12. The timing generator of claim 10, wherein the timing difference extractor comprises:

a first input terminal coupled to an output terminal of the signal synthesizer;

a second input terminal configured to receive the deformed timing signal; and an output terminal configured to output the timing difference signal.

13. The timing generator of claim 12, wherein the timing difference extractor is an XOR gate.

14. The timing generator of claim 12, wherein the timing difference extractor is an NOR gate.

15. The timing generator of claim 12, wherein the timing difference extractor is an AND gate.

16. The timing generator of claim 10, wherein:

the timing difference between the deformed timing signal and the timing signal is generated by an external circuit; and a pulse width of the timing signal is greater than a pulse width of the timing difference signal.

17. The timing generator of claim 10, wherein a current value of the first current is substantially equal to a current value of the second current.

18. The timing generator of claim 10, wherein the first switch, the second switch, the third switch and the fourth switch are N-type transistors.

* * * * *